United States Patent
Modave et al.

(10) Patent No.: US 11,776,601 B2
(45) Date of Patent: Oct. 3, 2023

(54) MONOTONIC COUNTER

(71) Applicant: PROTON WORLD INTERNATIONAL N.V., Diegem (BE)

(72) Inventors: Jean-Louis Modave, Ottignies (BE); Michael Peeters, Tourinnes-la-Grosse (BE); Ronny Van Keer, Hoeilaart (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 0 days.

(21) Appl. No.: 17/691,881

(22) Filed: Mar. 10, 2022

(65) Prior Publication Data
US 2022/0293151 A1   Sep. 15, 2022

(30) Foreign Application Priority Data

Mar. 15, 2021  (FR) ........................... 2102529

(51) Int. Cl.
*G11C 8/04*     (2006.01)
*G11C 7/20*     (2006.01)

(52) U.S. Cl.
CPC . *G11C 8/04* (2013.01); *G11C 7/20* (2013.01)

(58) Field of Classification Search
CPC .................................. G11C 8/14; G11C 7/20
See application file for complete search history.

(56) References Cited

U.S. PATENT DOCUMENTS

| | | | |
|---|---|---|---|
| 3,767,902 A | 10/1973 | Estes, III et al. | |
| 4,160,154 A | 7/1979 | Jennings | |
| 5,109,395 A | 4/1992 | Tanaka | |
| 5,450,460 A | 9/1995 | Stodieck | |
| 6,496,437 B2 | 12/2002 | Leung | |
| 6,687,325 B1 | 2/2004 | Wells | |
| 6,961,402 B1 | 11/2005 | Younis | |
| 7,551,706 B2 * | 6/2009 | Takagi | H03K 21/403 377/33 |
| 8,660,233 B2 | 2/2014 | Dawirs et al. | |
| 9,008,260 B2 | 4/2015 | Dawirs et al. | |
| 9,454,471 B2 | 9/2016 | Feldhofer et al. | |

(Continued)

FOREIGN PATENT DOCUMENTS

WO         85/04297 A1    9/1985

OTHER PUBLICATIONS

French Search Report and Written Opinion dated Dec. 20, 2011 from French Application No. 11/57006.

*Primary Examiner* — Son L Mai
(74) *Attorney, Agent, or Firm* — SEED INTELLECTUAL PROPERTY LAW GROUP LLP

(57) ABSTRACT

The present disclosure relates to a monotonic counter whose value is represented by a number N of binary words of N memory cells of a non-volatile memory, and being able to implement a step increment operation wherein if only one first memory cell represents a first value different from zero, then a second value equal to the said first value incremented by two times the said step is written into a second memory cell of rank directly higher than the rank of the first memory cell; and if a third and a fourth memory cell of consecutive ranks represent, respectively, a third value and a fourth value different from zero, then the third value of the third memory cell of lower rank is erased.

28 Claims, 5 Drawing Sheets

(56) References Cited

U.S. PATENT DOCUMENTS

2002/0075989 A1 6/2002 Joo
2004/0141580 A1 7/2004 Maletsky
2007/0147168 A1 6/2007 Pinto et al.
2018/0309453 A1 10/2018 Lim et al.

\* cited by examiner (a)

(b)

MONOTONIC COUNTER

CROSS-REFERENCE TO RELATED APPLICATION

Background

Technical Field

The present disclosure relates generally to electronic systems and devices implementing a counter. More particularly, the present disclosure relates to the implementation of a monotonic counter.

Description of Related Art

A counter is a hardware and/or software entity, able to count countable elements and/or measure quantities. A counter performs successive addition operations from a step to its value.

A counter may be implemented by various electronic devices and systems. As an example, a counter can be implemented by a processor storing the value of the counter in a cell of a memory. The counter values may be used, for example, to track a number of uses or a duration of use of an application program, a circuit or a medium, to facilitate cryptographic operations, etc.

A monotonic counter is a counter whose value is strictly increasing or decreasing as additions are made.

BRIEF SUMMARY

In an embodiment, a device comprises a non-volatile memory, which, in operation, stores a number N of binary words in N memory cells of the non-volatile memory, the N binary words representing a value of a monotonic counter, each binary word having a size sufficient to store a maximum value of the monotonic counter; and control circuitry coupled to the memory, wherein the control circuitry, in operation, increments the value of the monotonic counter by a step size. The incrementing the value of the monotonic counter by the step size includes: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

In an embodiment, a method comprises: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size, the incrementing the value of the monotonic counter by the step size including: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

In an embodiment, a system comprises: a processor, which, in operation, processes data; and a monotonic counter coupled to the processor, wherein the monotonic counter, in operation: stores a number N of binary words in N memory cells of a non-volatile memory, the N binary words representing a value of the monotonic counter, each binary word having a size sufficient to store a maximum value of the monotonic counter; and responds to an indication to increment the value of the monotonic counter by a step size by: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

In an embodiment, a non-transitory computer-readable medium's contents cause a monotonic counter to perform a method, the method comprising: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size, the incrementing the value of the monotonic counter by the step size including: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical or similar structural, dimensional, and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation represented in the figures.

Unless specified otherwise, the expressions "around," "approximately," "substantially" and "in the order of" signify within 10%, and within 5%.

In the disclosure, the value of a counter will be referred to as the value of the result of the last operation performed by that counter.

In addition, the modulo operation is hereinafter referred to as "mod."

Figure 1:
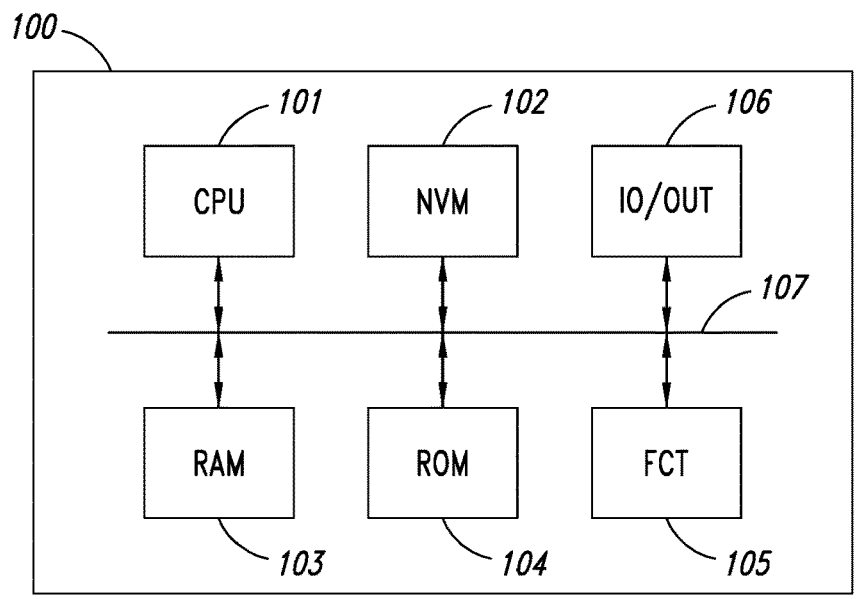
FIG. 1 represents, very schematically and in block form, an electronic device architecture.

FIG. 1 is a block diagram representing, very schematically, an architecture of an electronic device 100 implementing a monotonic counter.

The electronic device 100 comprises a processor 101 (CPU) able to implement various processing of data stored in memories and/or provided by other circuits of the device 100.

The electronic device 100 further comprises different types of memories, amongst which a non-volatile memory 102 (NVM), a volatile memory 103 (RAM), and a read-only memory 104 (ROM). Each memory is able to store different types of data.

The electronic device 100 further comprises various circuits 105 (FCT) able to perform different functions. By way of example, the circuits 105 may comprise measurement circuits, data conversion circuits, cryptographic circuits, etc.

The electronic device 100 may further comprise interface circuits 106 (IO/OUT) able to send and/or receive data from outside the device 100. The interface circuits 106 may be further able to implement a data display, for example, a display screen.

The electronic device 100 comprises one or more data buses 107 able to transfer data between its various components. More particularly, the bus 107 is able to transfer data stored in the memories 102 to 104 to the processor 101, the circuits 105 and the interface circuits 106.

Figure 2:
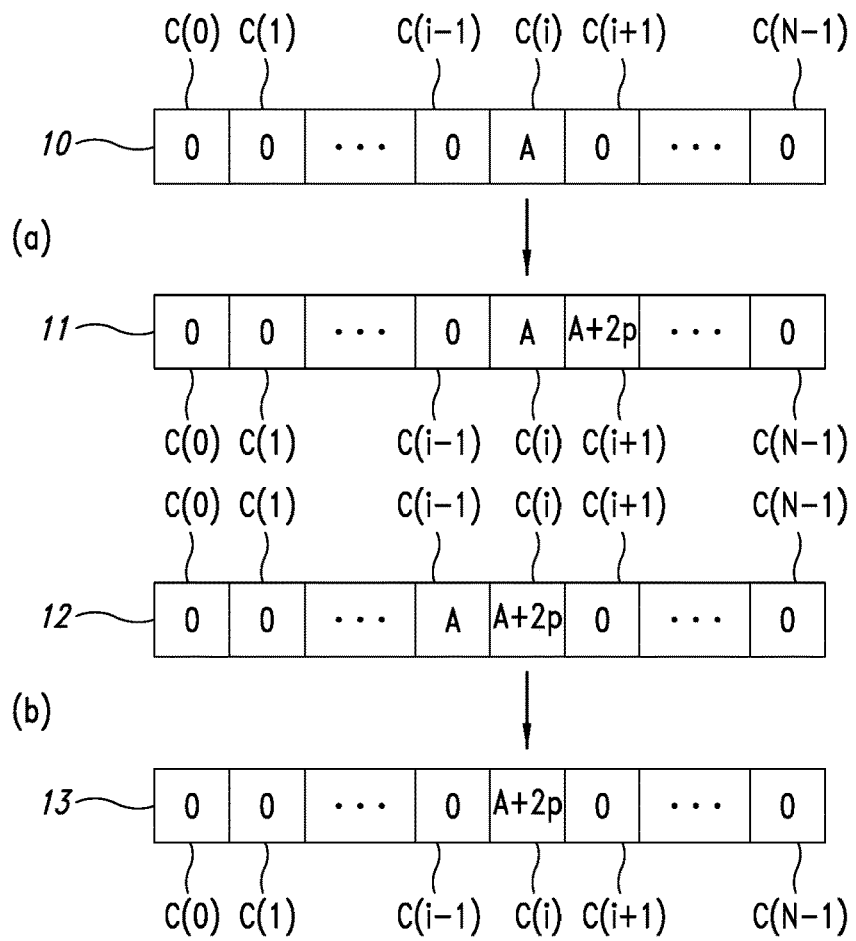
FIG. 2 represents, very schematically and in block form, the phases of an incrementing operation of an embodiment of a monotonic counter.

FIG. 2 groups two views (a) and (b). Each view (a), (b) illustrates a step for implementing an incrementing operation of one embodiment of a monotonic counter.

The monotonic counter of the present disclosure is, for example, implemented by an electronic device of the type of the device 100 described in relation to FIG. 1. More particularly, the value of the monotonic counter is stored in memory cells of the non-volatile memory 102. According to one embodiment, the non-volatile memory 102 is a Phase Change Memory (PCM), or an Electrically-Erasable Programmable Read-Only Memory (EEPROM). The storing and incrementing of the value of the monotonic counter in the memory cells may be controlled by control circuitry, such as control circuitry of the processor 101 or control circuitry of a functional circuit 105 or combinations thereof. The stored value may be used, for example, by the processor 101 or the functional circuit 105 or combinations thereof.

The monotonic counter is, in the case described in relation to FIG. 2, a counter adding, at each operation, a fixed step p to its value. The step is, for example, equal to one. In other words, at each new operation the value of the counter is incremented by the step p.

According to one embodiment, the monotonic counter is implemented using a number N, N being a natural number, of memory cells $C(0)$ to $C(N-1)$. The memory cells $C(0)$ to $C(N-1)$ are memory cells of the non-volatile memory 102 of FIG. 1. Each memory cell $C(0)$ to $C(N-1)$ is able to store a binary word, for example an octet. In the following, a memory cell is said to represent a value V when the said memory cell stores a binary word representing the value V. Furthermore, each memory cell $C(0)$ to $C(N-1)$ is able to store a binary word whose size is large enough to represent a maximum value that can be reached by the monotonic counter. According to one example, the memory cells $C(0)$ to $C(N-1)$ have consecutive memory addresses in the memory 102 or in the memory 104. According to one variant, the memory cells $C(0)$ to $C(N-1)$ do not have consecutive memory addresses in the memory 102 or in the memory 104.

An incrementing operation of the monotonic counter described herein includes two distinct phases, a write phase, and an erase phase. These phases are alternated at each new iteration of the counter. In particular, if at the last iteration a write phase of the incrementing operation took place, then an erase phase of the incrementing operation takes place at the next iteration, and vice versa.

View (a) of FIG. 2 represents a write phase of the increment operation, and view (b) represents an erase phase of the increment operation.

In view (a), a state 10 of the set of memory cells $C(0)$ to $C(N-1)$ is represented. Only one memory cell $C(i \bmod (N))$, or memory cell of rank i, where i is a natural number, represents a value different from zero. In other words, memory cell $C(i \bmod (N))$ represents a value A different from zero, and cells $C(0)$ to $C(i-1 \bmod (N))$ and $C(i+1 \bmod (N))$ to $C(N-1)$ represent the value zero. According to one variant, cells $C(i+2 \bmod (N))$ to $C(N-1)$ represent a value different from zero, such as a random value.

A writing phase of the incrementing operation allows to pass from state 10 to a state 11 in which the value A incremented by twice the value of the step p (i.e., the value A+2p) is written in the memory cell $C(i+1 \bmod (N))$ following the memory cell $C(i \bmod (N))$.

The state 10 represents the value A incremented by p (the value A+p) of the monotonic counter. The state 11 represents the value A incremented by twice the step p (the value A+2p) of the monotonic counter.

More generally, a writing phase of a counter incrementing operation occurs when the first memory cell representing a value different from zero is followed by a second memory cell representing the value zero. The incrementing operation is then a writing of the value of the first cell incremented by twice the step p to the second memory cell.

In view (b), a state 12 of the set of memory cells C(0) to C(N−1) is represented. Two consecutive memory cells C(i−1 mod (N)) and C(i mod(N)) represent values different from zero. Specifically, the memory cell C(i−1 mod (N)) represents a value A, and the memory cell C(i mod (N)) represents the value A incremented by twice the step p (i.e., the value A+2p). The state 12 is a state equivalent to the state 11 in view (a).

An erasing phase of the incrementing operation moves from the state 12 to a state 13 in which the value represented by memory cell C(i−1 mod (N)) is erased, so that the memory cell C(i−1 mod (N)) represents the value zero. The state 13 is a state equivalent to the state 10 in view (a).

The state 12 represents the value A incremented by two times p (A+2p) of the monotonic counter. The state 13 represents the value A incremented by three times the step p (the value A+3p) of the monotonic counter.

More generally, an erasing phase of a counter incrementing operation occurs when the first memory cell representing a value different from zero is followed by a second memory cell representing a value different from zero. The incrementing operation is then an erasing of the value of the first cell.

An advantage of the incrementing operation described here is that it minimizes the number of elementary writing and erasing operations of an incrementing operation. Indeed, in a monotonic counter whose value is written in a single memory cell, each incrementing operation requires an elementary operation of erasing the value from the memory cell, then an elementary operation of writing the incremented value in the memory cell. The incrementing operation of the present embodiment allows the number of elementary operations to be divided by two. Reducing the number of elementary operations allows to reduce the power consumption of the counter, to increase its execution speed, and to improve its endurance. It is said that the more enduring a counter is, the greater the number of operations it can implement during the lifetime of the device executing it.

Another advantage of the incrementing operation described here is that it respects the atomicity criterion.

Figure 3:
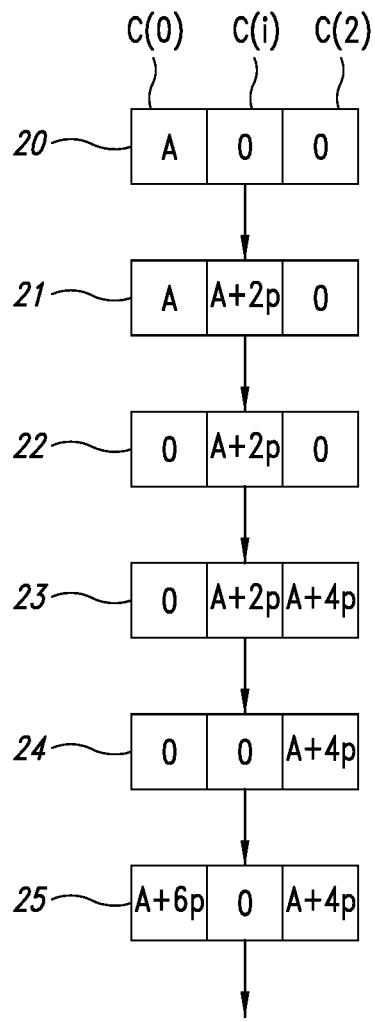
FIG. 3 represents, very schematically and in block form, an example of an incrementation operation of FIG. 2.

FIG. 3 represents steps for implementing successive incrementing operations of the monotonic counter of FIG. 2. In the example described herein, the monotonic counter is implemented using three memory cells C(0), C(1) and C(2).

In a step 20, the memory cell C(0) represents a value A. The memory cells C(1) and C(2) represent a value zero. The value of the monotonic counter represented by the memory cells C(0) to C(2), at this step, is the value A incremented by step p (the value A+p).

In a step 21, following the step 20, the monotonic counter has implemented an incrementing operation of the state of step 20. In view of the configuration of the memory cells C(0) to C(2), a writing phase of the incrementing operation has been implemented by the monotonic counter. Thus, the value A incremented by twice the step p was written in the memory cell C(1). The value of the monotonic counter represented by the memory cells C(0) to C(2), at this step, is the value A incremented by twice the step p (the value A+2p).

In a step 22, following the step 21, the monotonic counter has implemented an incrementing operation of the state of step 21. In view of the configuration of the memory cells C(0) to C(2), an erasing phase of the incrementing operation has been implemented by the monotonic counter. Thus, the value of the memory cell C(0) has been erased, and the memory cell C(0) then represents the value zero. The value of the monotonic counter represented by the memory cells C(0) to C(2), at this step, is the value A incremented by three times the step p (the value A+3p).

In a step 23, following the step 22, the monotonic counter has implemented an incrementing operation of the state of step 22. In view of the configuration of the memory cells C(0) to C(2), a writing phase of the incrementing operation has been implemented by the monotonic counter. Thus, the value A incremented by four times the step p has been written to the memory cell C(2). The value of the monotonic counter represented by the memory cells C(0) to C(2), at this step, is the value A incremented by four times the step p (the value A+4p).

In a step 24, following the step 23, the monotonic counter has implemented an incrementing operation of the state of step 23. In view of the configuration of the memory cells C(0) to C(2), an erasing phase of the incrementing operation has been implemented by the monotonic counter. Thus, the value of the memory cell C(1) has been erased, and the memory cell C(1) then represents the value zero. The value of the monotonic counter represented by the memory cells C(0) to C(2), at this step, is the value A incremented by five times the step p (the value A+5p).

In a step 25, following the step 24, the monotonic counter has implemented an incrementing operation of the state of step 24. In view of the configuration of the memory cells C(0) to C(2), a writing phase of the incrementing operation has been implemented by the monotonic counter. Thus, the value A incremented by six times the step p has been written in the memory cell C(0). The value of the monotonic counter represented by the memory cells C(0) to C(2), at this step, is the value A incremented by six times the step p (the value A+6p).

Figure 4:
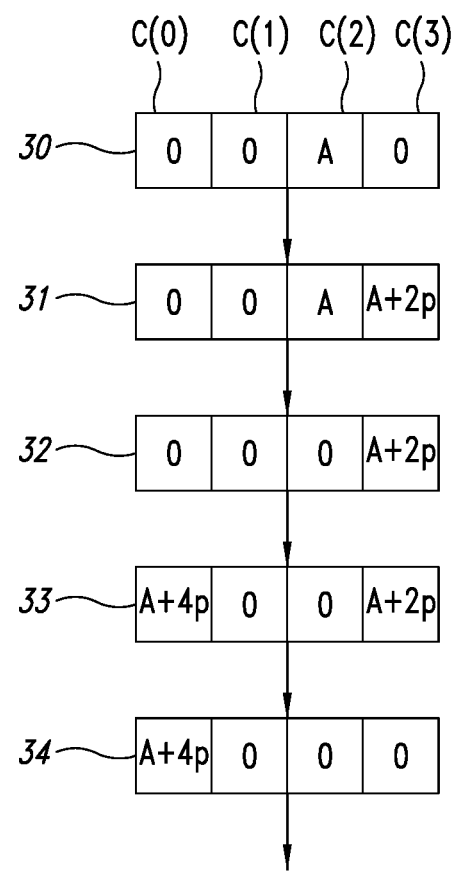
FIG. 4 represents, very schematically and in block form, an example of the implementation of the incrementation operations of FIG. 2.

FIG. 4 represents steps for implementing successive incrementing operations of the monotonic counter of FIG. 2. In the example described herein, the monotonic counter is implemented using four memory cells C(0), C(1), C(2) and C(3).

In one step 30, the memory cell C(2) represents a value A. Memory cells C(0), C(1), and C(3) represent a value zero. The value of the monotonic counter represented by the memory cells C(0) to C(3), at this step, is the value A incremented by step p (the value A+p).

In a step 31, following the step 30, the monotonic counter has implemented an incrementing operation of the state of step 30. In view of the configuration of the memory cells C(0) to C(3), a writing phase of the incrementing operation has been implemented by the monotonic counter. Thus, the value A incremented by two times the step p has been written in the memory cell C(3). The value of the monotonic counter represented by the memory cells C(0) to C(3), at this step, is the value A incremented by twice the step p (the value A+2p).

In a step 32, following the step 31, the monotonic counter has implemented an incrementing operation of the state of step 31. In view of the configuration of the memory cells C(0) to C(3), an erasing phase of the incrementing operation has been implemented by the monotonic counter. Thus, the value of the memory cell C(2) has been erased, and the memory cell C(2) then represents the value zero. The value of the monotonic counter represented by the memory cells C(0) to C(3), at this step, is the value A incremented by three times the step p (the value A+3p).

In a step 33, following the step 32, the monotonic counter has implemented an incrementing operation of the state of step 32. In view of the configuration of the memory cells C(0) to C(3), a writing phase of the incrementing operation has been implemented by the monotonic counter. Thus, the value A incremented by four times the step p has been written in the memory cell C(0). The value of the monotonic counter represented by the memory cells C(0) to C(3), at this step, is the value A incremented by four times the step p (the value A+4p).

In a step 34, following the step 33, the monotonic counter has implemented an incrementing operation of the state of step 33. In view of the configuration of the memory cells C(0) to C(3), an erasing phase of the incrementing operation has been implemented by the monotonic counter. Thus, the value of the memory cell C(3) has been erased, and the memory cell C(3) then represents the value zero. The value of the monotonic counter represented by the memory cells C(0) to C(3), in this step, is the value A incremented by five times the step p (the value A+5p).

Figure 5:
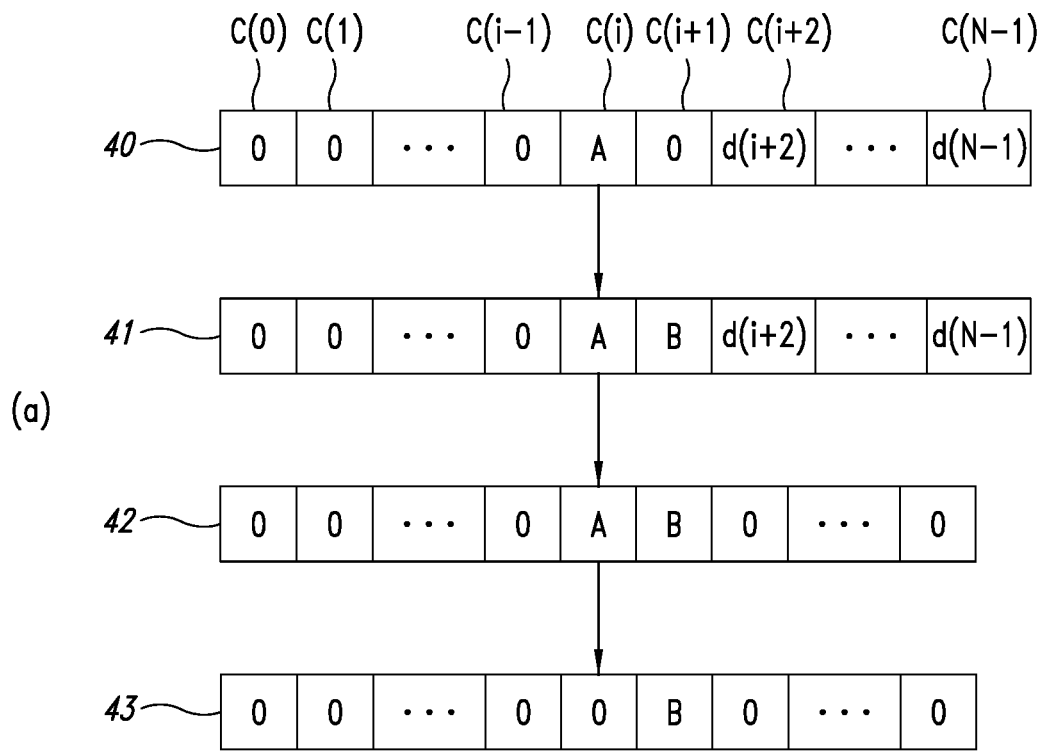
FIG. 5 represents, very schematically and in block form, phases of a zeroing operation of one embodiment of a monotonic counter.
Figure 5:
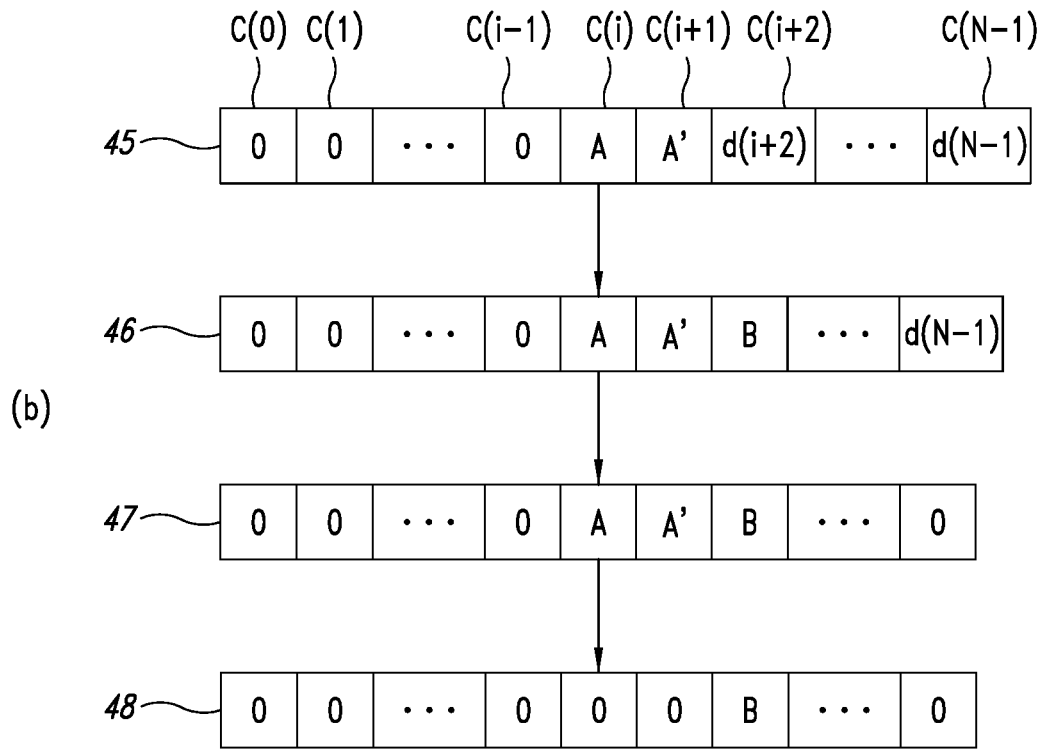

FIG. 5 groups two views (a) and (b). Each view (a), (b) illustrates a case of implementation of a monotonic counter zeroing operation whose incrementing operation is described in relation to FIGS. 2 to 4.

As described in FIG. 2, the monotonic counter is implemented using a number N of memory cells C(0) to C(N−1). The memory cells C(0) to C(N−1) are, for example, memory cells in the non-volatile memory 102 of the device 100 of FIG. 1. Each memory cell C(0) to C(N−1) is able to store a binary word, for example an octet. In the following, a memory cell is said to represent a value V when the said memory cell stores a binary word representing the value V. Furthermore, each memory cell C(0) to C(N−1) is able to store a binary word whose size is large enough to represent a maximum value that the monotonic counter can reach. According to one example, the memory cells C(0) to C(N−1) have consecutive memory addresses in the memory 102 or in the memory 104. According to one variant, the memory cells C(0) to C(N−1) do not have consecutive memory addresses in the memory 102 or in the memory 104.

The monotonic counter is able to implement a zeroing operation of its value, an operation to force the monotonic value of the counter to a value considered to be the initial value of the counter, for example, the value zero. The object of this zeroing operation is to write the value zero in all the memory cells, except for one memory cell in which the initial value of the counter subtracted from the step p is written. Thus, the memory cells C(0) to C(N−1) are in a state of the type of state 10 in FIG. 2, and the value of the counter is equal to its initial value subtracted by step p to which step p, the initial value of the counter, is added. The zeroing operation may be performed, for example, at each start, or restart, of the monotonic counter.

View (a) of FIG. 5 illustrates the implementation of a zeroing operation in the case where a single memory cell represents the value of the monotonic counter.

In a step 40, the first cell representing a value different from zero is a memory cell C(i), or memory cell of rank i, where i ranges from 0 to N−1. The memory cells C(0) to C(i−1) thus all represent the value zero. The cell C(i+1) represents the value zero. Cells C(i+2) to C(N−1) represent values d(i+2) to d(N−1). The values d(i+2) to d(N−1) are random values to be removed in order to perform incrementing operations as described in relation to FIGS. 2 to 4.

In a step 41, a value B is written to the memory cell C(i+1). This value B is a value corresponding to the initial value of the counter subtracted by the step p.

At a step 42, all the values of the memory cells whose rank is higher than the rank of the memory cell C(i+1) are erased. Thus, the memory cells C(i+2) to C(N−1) represent the value zero.

In a step 43, the value A represented by the cell C(i) is erased. The cells C(0) to C(N−1) are then in a configuration of the type of state 10 described in relation to FIG. 2. The value of the monotonic counter is thus equal to its initial value. A writing phase of the monotonic counter incrementing operation can then be performed.

View (b) of FIG. 5 illustrates the implementation of a zeroing operation in the case where two consecutive memory cells represent the value of the monotonic counter.

In one step 45, the first cell representing a value different from zero, is the memory cell C(i). The memory cell C(i+1) further represents a value A' different from the value zero. According to one example, the memory cell C(i+1) represents the value A incremented by twice the counter step p (A+2p). The memory cells C(0) to C(i−1) all represent the value zero. The cells C(i+2) to C(N−1) represent the values d(i+2) to d(N−1). The values d(i+2) to d(N−1) are random values to be erased in order to perform the incrementing operations as described in relation to FIGS. 2 to 4.

In a step 46, the value B is written to the memory cell C(i+2). The value B is the initial value of the counter subtracted by the step p. For this purpose, the value d(i+2) of the memory cell C(i+2) is first erased, and then, in a second step, the value B is written into the memory cell C(i+2).

In a step 47, all the values of the memory cells whose rank is higher than the rank of the memory cell C(i+2) are erased. Thus, the memory cells C(i+2) to C(N−1) represent the value zero.

In a step 48, the values A and A' represented by the memory cells C(i) and C(i+1) are erased. The cells C(0) to C(N−1) are then in a configuration of the type of state 10 described in relation to FIG. 2. The value of the monotonic counter is thus equal to its initial value. A writing phase of the monotonic counter incrementing operation can then be performed.

Figure 6:
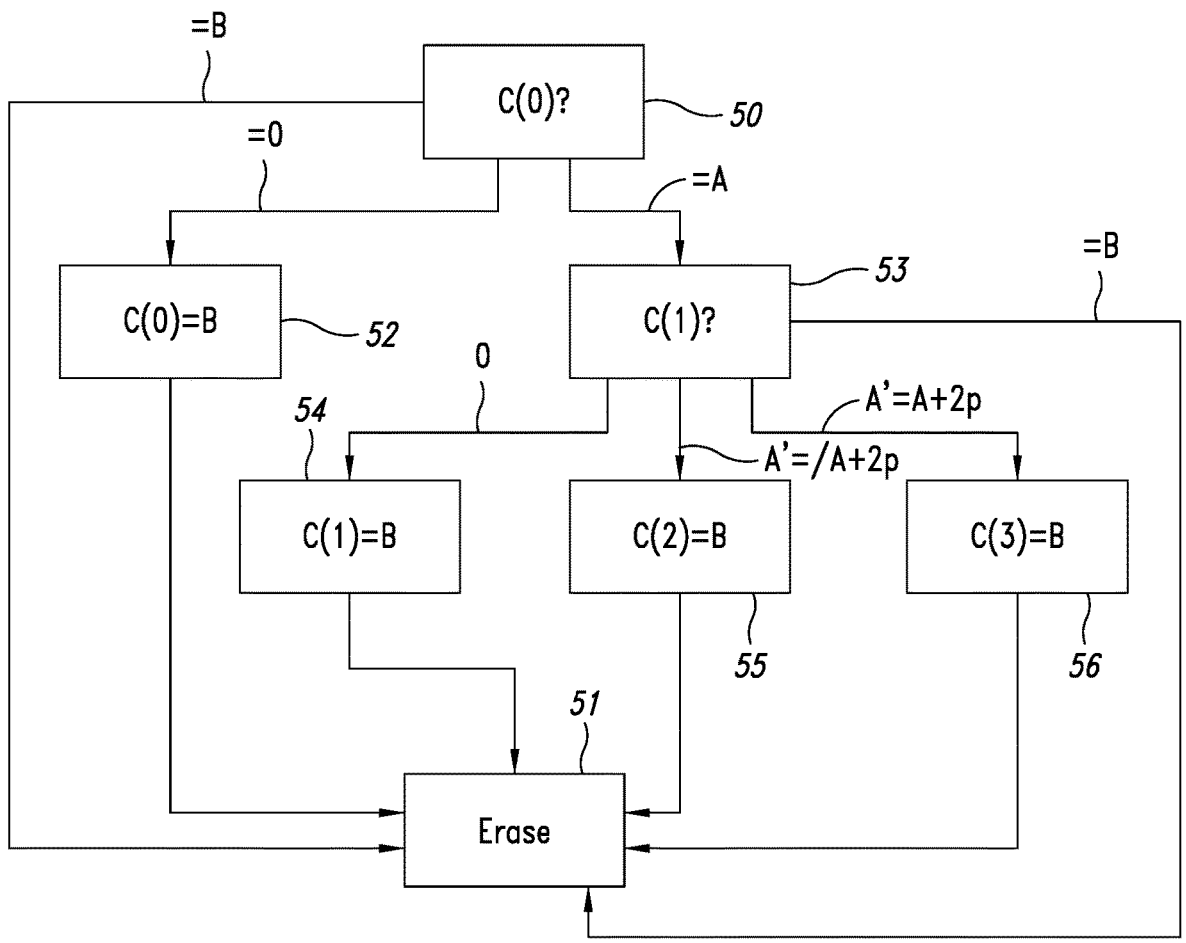
FIG. 6 represents, in the form of a flow chart, phases of an initialization operation of one embodiment of a monotonic counter.

FIG. 6 is a flowchart illustrating the steps of an initialization operation of the monotonic counter whose incrementing operation is described in relation to FIGS. 2 to 4.

As described in relation to FIGS. 2 and 4, the monotonic counter is implemented using a number N of the memory cells C(0) to C(N−1). The memory cells C(0) to C(N−1) are memory cells in the non-volatile memory 102 of the device 100 of FIG. 1. Each memory cell C(0) to C(N−1) is able to store a binary word, for example an octet. In the following part of the disclosure, a memory cell is said to represent a value V when the said memory cell stores a binary word representing the value V. Furthermore, each memory cell C(0) to C(N−1) is able to store a binary word whose size is large enough to represent a maximum value that the monotonic counter can reach. According to one example, the memory cells C(0) to C(N−1) have consecutive memory addresses in the memory 102 or in the memory 104, for example directly consecutive memory addresses. According to one variant, the memory cells C(0) to C(N−1) do not have consecutive memory addresses in the memory 102 or in the memory 104.

The monotonic counter is further able to implement an initialization operation of the binary words written in the memory cells C(0) to C(N−1) used for its implementation. This initialization operation allows to stabilize the values represented by the memory cells C(0) to C(N−1) after a stop of the counter. More particularly, the object of this operation is to put the memory cells C(0) to C(N−1) in a state similar to the state 10 or the state 12 both described in relation to FIG. 2.

At a step 50 (C(0)?), the value represented by the first memory cell C(0) is read. If this value is equal to the value B (output=B in FIG. 6), which is the initial value of the counter subtracted by the step p, then the next step is a step 51 (Erase). If this value is equal to zero (output=0 in FIG. 6), then the next step is a step 52 (C(0)=B). If this value is equal to a value A different from zero and the value B (output=A in FIG. 6), then the next step is a step 53 (C(1)?).

In step 52, the value B is written to the memory cell C(0). The next step is the erase step 51.

In step 53, the value represented by the memory cell C(1) is read. If this value is equal to the value B (output=B in FIG. 6), then the next step is the erase step 51. If this value is equal to zero (output=0 in FIG. 6), then the next step is a step 54 (C(1)=B). If this value is equal to a value A' which is different from the value A incremented by twice the step p (output A'=/A+2p in FIG. 6), then the next step is a step 55 (C(2)=B). If this value is equal to a value A' which is the value A incremented by two times the step p (output A'=A+2p in FIG. 6), then the next step is a step 56 (C(3)=B).

In the step 54, the value B is written to the memory cell C(1). The next step is the erase step 51.

In the step 55, the value in the memory cell C(2) is erased. The value B is written to the memory cell C(2). The next step is the erase step 51.

In the step 56, the value in the memory cell C(3) is erased. The value B is written to the memory cell C(3). The next step is the erase step 51.

In the erase step 51, all the values in the memory cells whose rank is higher than that of the memory cell representing the value B are erased. In addition, the values of the two cells with a rank directly lower than the cell representing the value B are erased. The initialization operation is completed.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

An embodiment facilitates addressing all or some of the drawbacks of known monotonic counter implementation.

One embodiment provides for a monotonic counter whose value is represented by a number N of binary words of N memory cells of a non-volatile memory, each binary word having a size able to represent the maximum value of the said counter, and being able to implement a one-step incrementing operation wherein:

if only a first memory cell represents a first value different from zero, then a second value equal to the said first value incremented by two times the said step is written to a second memory cell of rank directly higher than the modulo N rank of the first memory cell; and if a third and a fourth memory cell of consecutive ranks represent, respectively, a third value and a fourth value different from zero, then the third value of the third memory cell of lower rank than modulo N is erased.

Another embodiment provides a method for implementing an incrementing operation of a monotonic counter, the value of which is represented by a number N of binary words of N memory cells of a non-volatile memory, each binary word having a size able to represent the maximum value of the said counter, wherein:

if only one first memory cell represents a first value different from zero, then a second value equal to the said first value incremented by two times the said step is written to a second memory cell of the rank directly higher than the modulo N rank of the first memory cell; and if a third and a fourth memory cell of consecutive ranks represent, respectively, a third value and a fourth value different from zero, then the third value of the third memory cell of the rank lower than modulo N is erased.

According to one embodiment, if the first memory cell represents the first value different from zero, the value of the said counter is equal to the first value incremented by the step.

According to one embodiment, if the third and fourth memory cells represent, respectively, a third value and a fourth value different from zero, the value of the said counter is equal to the first value incremented by two times the step.

According to one embodiment, the number N is three.

According to one embodiment, the number N is four.

According to one embodiment, the memory cells have consecutive memory addresses.

According to one embodiment, the step is a fixed step.

According to one embodiment, the non-volatile memory is a phase change memory.

According to one embodiment, the non-volatile memory is an EEPROM type memory.

According to one embodiment, the counter is able to implement a reset operation in which all values of the memory cells are erased except for a fifth memory cell in which a fifth value equal to an initial value of the monotonic counter subtracted from the said step is written.

According to one embodiment, the said counter is able to implement an initialization operation of the memory cells in which an initial value of the monotonic counter subtracted from the said step is written in:

the memory cell of rank zero if the value of the said memory cell of rank zero is equal to zero.

the memory cell of rank one if the value of the said memory cell of rank zero is different from zero and if the value of the memory cell of rank one is equal to zero.

the memory cell of rank two if the value of the said memory cell of rank zero is different from zero and if the value of the memory cell of rank one is different from the value of the said memory cell of rank zero; and the memory cell of rank two if the value of the said memory cell of rank zero is different from zero and if the value of the memory cell of rank one is equal to the value of the said memory cell of rank zero, then all the values of the memory cells of rank higher than the memory cell representing the initial value of the monotonic counter subtracted from the said step are erased.

In an embodiment, a device comprises a non-volatile memory, which, in operation, stores a number N of binary words in N memory cells of the non-volatile memory, the N binary words representing a value of a monotonic counter, each binary word having a size sufficient to store a maximum value of the monotonic counter; and control circuitry coupled to the memory, wherein the control circuitry, in operation, increments the value of the monotonic counter by a step size. The incrementing the value of the monotonic counter by the step size includes: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells. In an embodiment, the control circuitry, in operation, determines a current value of the monotonic counter, the determining the value of the monotonic counter including: in response to a single memory cell of the N memory cells representing a value different from zero, determining the value of the monotonic counter is equal to the value of the single memory cell incremented by the step size. In an embodiment, the determining the value of the monotonic counter includes: in response to two memory cells of the N memory cells of consecutive ranks representing values different from zero, determining the value of the monotonic counter is equal to a value of a memory cell of the two memory cells having a rank higher than a rank of the other of the two memory cells. In an embodiment, the number N is three. In an embodiment, the number N is four. In an embodiment, the memory cells of the N memory cells have consecutive memory addresses. In an embodiment, the step size is a fixed step size. In an embodiment, the non-volatile memory is a phase change memory. In an embodiment, the non-volatile memory is an EEPROM. In an embodiment, the control circuitry, in operation, initializes a value of the monotonic counter, the initializing the value of the monotonic counter including: erasing all of the memory cells of the N memory cells except one memory cell of the N memory cells; subtracting an initial value of the monotonic counter from the step size and writing a result of the subtracting into the one memory cell of the N memory cells. In an embodiment, the control circuitry, in operation, initializes a value of the monotonic counter, the initializing the value of the monotonic counter including: in response to a value of a memory cell of rank zero modulo N being equal to zero, writing a value equal to an initial value of the monotonic counter subtracted from the step size into the memory cell of rank zero modulo N; in response to the value of the memory cell of rank zero modulo N being different from zero and a value of a memory cell of rank one modulo N being equal to zero, writing the value equal to the initial value of the monotonic counter subtracted from the step size into the memory cell of rank one modulo N; in response to the value of the memory cell of rank zero modulo N being different from zero and the value of a memory cell of rank one modulo N being different from the value of the memory cell of rank zero modulo N, writing the value equal to the initial value of the monotonic counter subtracted from the step size into a memory cell of rank two modulo N; in response to the value of the memory cell of rank zero modulo N being different from zero and the value of a memory cell of rank one modulo N being equal to the value of the memory cell of rank zero modulo N, writing the value equal to the initial value of the monotonic counter subtracted from the step size into the memory cell of rank two modulo N; and in response to the value equal to the initial value of the monotonic counter subtracted from the step size being written into a memory cell of the N memory cells, erasing the memory cells of the N memory cells having a rank higher than a rank of the memory cell into which the value equal to the initial value of the monotonic counter subtracted from the step size is written. In an embodiment, the initializing includes, in response to the memory cell of rank zero modulo N having a value equal to the initial value of the monotonic counter subtracted from the step size, erasing all of the memory cells having a rank modulo N higher than zero.

In an embodiment, a method comprises: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size, the incrementing the value of the monotonic counter by the step size including: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells. In an embodiment, the method comprises: determining a current value of the monotonic counter, the determining the value of the monotonic counter including: in response to a single memory cell of the N memory cells representing a value different from zero, determining the value of the monotonic counter is equal to the value of the single memory cell incremented by the step size. In an embodiment, the determining the value of the monotonic counter includes: in response to two memory cells of the N memory cells of consecutive ranks representing values different from zero, determining the value of the monotonic counter is equal to a value of a memory cell of the two memory cells having a rank higher than a rank of the other of the two memory cells. In an embodiment, the number N is three. In an embodiment, the number N is four. In an embodiment, the memory cells of the N memory cells have consecutive memory addresses. In an embodiment, the step size is a fixed step size. In an embodiment, the method comprises initializing a value of the monotonic counter, the initializing the value of the monotonic counter including: erasing all of the memory cells of the N memory cells except one memory cell of the N memory cells; subtracting an initial value of the monotonic counter from the step size and writing a result of the subtracting into the one memory cell of the N memory cells. In an embodiment, the method comprises initializing a value of the monotonic counter, the initializing the value of the monotonic counter including: in response to a value of a memory cell of rank zero modulo N being equal to zero, writing a value equal to an initial value of the monotonic counter subtracted from the step size into the memory cell of rank zero modulo N; in response to the value of the memory cell of rank zero modulo N being different from zero and a value of a memory cell of rank one modulo N being equal to zero, writing the value equal to the initial value of the monotonic counter subtracted from the step size into the memory cell of rank one modulo N; in response to the value of the memory cell of rank zero modulo N being different from zero and the value of a memory cell of rank one modulo N being different from the value of the memory cell of rank zero modulo N, writing the value equal to the initial value of the monotonic counter subtracted from the step size into a memory cell of rank two modulo N; in response to the value of the memory cell of rank zero modulo N being different from zero and the value of a memory cell of rank one modulo N being equal to the value of the memory cell of rank zero modulo N, writing the value equal to the initial value of the monotonic counter subtracted from the step size into the memory cell of rank two modulo N; and in response to the value equal to the initial value of the monotonic counter subtracted from the step size being written into a memory cell of the N memory cells, erasing the memory cells of the N memory cells having a rank higher than a rank of the memory cell into which the value equal to the initial value of the monotonic counter subtracted from the step size is written. In an embodiment, the initializing includes, in response to the memory cell of rank zero modulo N having a value equal to the initial value of the monotonic counter subtracted from the step size, erasing all of the memory cells having a rank modulo N higher than zero.

In an embodiment, a system comprises: a processor, which, in operation, processes data; and a monotonic counter coupled to the processor, wherein the monotonic counter, in operation: stores a number N of binary words in N memory cells of a non-volatile memory, the N binary words representing a value of the monotonic counter, each binary word having a size sufficient to store a maximum value of the monotonic counter; and responds to an indication to increment the value of the monotonic counter by a step size by: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells. In an embodiment, the monotonic counter, in operation, determines a current value of the monotonic counter, the determining the current value of the monotonic counter including: in response to a single memory cell of the N memory cells representing a value different from zero, determining the value of the monotonic counter is equal to the value of the single memory cell incremented by the step size; and in response to two memory cells of the N memory cells of consecutive ranks representing values different from zero, determining the value of the monotonic counter is equal to a value of a memory cell of the two memory cells having a rank higher than a rank of the other of the two memory cells. In an embodiment, the system comprises an integrated circuit including the processor and the monotonic counter.

In an embodiment, a non-transitory computer-readable medium's contents cause a monotonic counter to perform a method, the method comprising: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size, the incrementing the value of the monotonic counter by the step size including: in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells. In an embodiment, the method comprises: determining a current value of the monotonic counter, the determining the value of the monotonic counter including: in response to a single memory cell of the N memory cells representing a value different from zero, determining the value of the monotonic counter is equal to the value of the single memory cell incremented by the step size; and in response to two memory cells of the N memory cells of consecutive ranks representing values different from zero, determining the value of the monotonic counter is equal to a value of a memory cell of the two memory cells having a rank higher than a rank of the other of the two memory cells. In an embodiment, the contents comprise instructions executed by the monotonic counter.

According to one embodiment, during the update operation, if the memory cell of rank zero is equal to the initial value of the monotonic counter subtracted from the said step, then all values of the memory cells of rank higher than the memory cell of rank zero are erased.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a non-volatile memory, which, in operation, stores a number N of binary words in N memory cells of the non-volatile memory, the N binary words representing a value of a monotonic counter, each binary word having a size sufficient to store a maximum value of the monotonic counter; and
 control circuitry coupled to the memory, wherein the control circuitry, in operation, increments the value of the monotonic counter by a step size, the incrementing of the value of the monotonic counter by the step size including:
  in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

2. The device according to claim 1, wherein the control circuitry, in operation, determines a current value of the monotonic counter, the determining of the value of the monotonic counter including:

in response to a single memory cell of the N memory cells representing a value different from zero, determining the value of the monotonic counter is equal to the value of the single memory cell incremented by the step size.

3. The device according to claim 2, wherein the determining of the value of the monotonic counter includes:

in response to two memory cells of the N memory cells of consecutive ranks representing values different from zero, determining the value of the monotonic counter is equal to a value of a memory cell of the two memory cells having a rank higher than a rank of the other of the two memory cells.

4. The device according to claim 1, wherein the number N is three.

5. The device according to claim 1, wherein the number N is four.

6. The device according to claim 1, wherein the memory cells of the N memory cells have consecutive memory addresses.

7. The device according to claim 1, wherein the step size is a fixed step size.

8. The device according to claim 1, wherein the non-volatile memory is a phase change memory.

9. The device according to claim 1, wherein the non-volatile memory is an EEPROM.

10. The device according to claim 1, wherein the control circuitry, in operation, initializes a value of the monotonic counter, the initializing of the value of the monotonic counter including:

erasing all of the memory cells of the N memory cells except one memory cell of the N memory cells; and subtracting an initial value of the monotonic counter from the step size and writing a result of the subtracting into the one memory cell of the N memory cells.

11. The device according to claim 1, wherein the control circuitry, in operation, initializes a value of the monotonic counter, the initializing of the value of the monotonic counter including:

in response to a value of a memory cell of rank zero modulo N being equal to zero, writing a value equal to an initial value of the monotonic counter subtracted from the step size into the memory cell of rank zero modulo N;

in response to the value of the memory cell of rank zero modulo N being different from zero and a value of the memory cell of rank one modulo N being equal to zero, writing the value equal to the initial value of the monotonic counter subtracted from the step size into the memory cell of rank one modulo N;

in response to the value of the memory cell of rank zero modulo N being different from zero and the value of the memory cell of rank one modulo N being different from the value of the memory cell of rank zero modulo N, writing the value equal to the initial value of the monotonic counter subtracted from the step size into a memory cell of rank two modulo N;

in response to the value of the memory cell of rank zero modulo N being different from zero and the value of a memory cell of rank one modulo N being equal to the value of the memory cell of rank zero modulo N, writing the value equal to the initial value of the monotonic counter subtracted from the step size into the memory cell of rank two modulo N; and in response to the value equal to the initial value of the monotonic counter subtracted from the step size being written into a memory cell of the N memory cells, erasing the memory cells of the N memory cells having a rank higher than a rank of the memory cell into which the value equal to the initial value of the monotonic counter subtracted from the step size is written.

12. The device according to claim 11, wherein, the initializing includes, in response to the memory cell of rank zero modulo N having a value equal to the initial value of the monotonic counter subtracted from the step size, erasing all of the memory cells having a rank modulo N higher than zero.

13. A method, comprising:

storing a number N of binary words in N memory cells of a non-volatile memory, the N binary words representing a value of a monotonic counter, each binary word having a size sufficient to store a maximum value of the monotonic counter; and incrementing the value of the monotonic counter by a step size, the incrementing of the value of the monotonic counter by the step size including:

in response to a single memory cell of the N memory cells having a value different from zero, the single memory cell having a rank i modulo N, writing a value equal to the value of the single memory cell incremented by two times the step size, into a second memory cell of rank i+1 modulo N; and in response to two memory cells of the N memory cells of consecutive ranks representing values different from zero, erasing a memory cell of the two memory cells having a lower rank than a rank of the other of the two memory cells.

14. The method according to claim 13, comprising:

determining a current value of the monotonic counter, the determining of the value of the monotonic counter including:

in response to a single memory cell of the N memory cells representing a value different from zero, determining the value of the monotonic counter is equal to the value of the single memory cell incremented by the step size.

15. The method according to claim 14, wherein the determining of the value of the monotonic counter includes:

in response to two memory cells of the N memory cells of consecutive ranks representing values different from zero, determining the value of the monotonic counter is equal to a value of a memory cell of the two memory cells having a rank higher than a rank of the other of the two memory cells.

16. The method according to claim 13, wherein the number N is three.

17. The method according to claim 13, wherein the number N is four.

18. The method according to claim 13, wherein the memory cells of the N memory cells have consecutive memory addresses.

19. The method according to claim 13, wherein the step size is a fixed step size.

20. The method according to claim 13, comprising initializing a value of the monotonic counter, the initializing of the value of the monotonic counter including:
   erasing all of the memory cells of the N memory cells except one memory cell of the N memory cells; and
   subtracting an initial value of the monotonic counter from the step size and writing a result of the subtracting into the one memory cell of the N memory cells.

21. The method according to claim 13, comprising initializing a value of the monotonic counter, the initializing of the value of the monotonic counter including:
   in response to a value of a memory cell of rank zero modulo N being equal to zero, writing a value equal to an initial value of the monotonic counter subtracted from the step size into the memory cell of rank zero modulo N;
   in response to the value of the memory cell of rank zero modulo N being different from zero and a value of the memory cell of rank one modulo N being equal to zero, writing the value equal to the initial value of the monotonic counter subtracted from the step size into the memory cell of rank one modulo N;
   in response to the value of the memory cell of rank zero modulo N being different from zero and the value of the memory cell of rank one modulo N being different from the value of the memory cell of rank zero modulo N, writing the value equal to the initial value of the monotonic counter subtracted from the step size into a memory cell of rank two modulo N;
   in response to the value of the memory cell of rank zero modulo N being different from zero and the value of the memory cell of rank one modulo N being equal to the value of the memory cell of rank zero modulo N, writing the value equal to the initial value of the monotonic counter subtracted from the step size into the memory cell of rank two modulo N; and
   in response to the value equal to the initial value of the monotonic counter subtracted from the step size being written into a memory cell of the N memory cells, erasing the memory cells of the N memory cells having a rank higher than a rank of the memory cell into which the value equal to the initial value of the monotonic counter subtracted from the step size is written.

22. The method according to claim 21, wherein, the initializing includes, in response to the memory cell of rank zero modulo N having a value equal to the initial value of the monotonic counter subtracted from the step size, erasing all of the memory cells having a rank modulo N higher than zero.

23. A system, comprising:
   a processor, which, in operation, processes data; and
   a monotonic counter coupled to the processor, wherein the monotonic counter, in operation:
      stores a number N of binary words in N memory cells of a non-volatile memory, the N binary words representing a value of the monotonic counter, each binary word having a size sufficient to store a maximum value of the monotonic counter; and
      responds to an indication to increment the value of the monotonic counter by a step size by:
         in response to a single memory cell of the N memory cells having a value different from zero, the single memory cell having a rank i modulo N, writing a value equal to the value of the single memory cell incremented by two times the step size, into a second memory cell of rank i+1 modulo N; and
         in response to two memory cells of the N memory cells of consecutive ranks representing values different from zero, erasing a memory cell of the two memory cells having a lower rank than a rank of the other of the two memory cells.

24. The system according to claim 23, wherein the monotonic counter, in operation, determines a current value of the monotonic counter, the determining of the current value of the monotonic counter including:
   in response to the single memory cell of the N memory cells representing a value different from zero, determining the value of the monotonic counter is equal to the value of the single memory cell incremented by the step size; and
   in response to two memory cells of the N memory cells of consecutive ranks representing values different from zero, determining the value of the monotonic counter is equal to a value of a memory cell of the two memory cells having a rank higher than a rank of the other of the two memory cells.

25. The system of claim 23, comprising an integrated circuit including the processor and the monotonic counter.

26. A non-transitory computer-readable medium having contents which cause a monotonic counter to perform a method, the method comprising:
   storing a number N of binary words in N memory cells of a non-volatile memory, the N binary words representing a value of a monotonic counter, each binary word having a size sufficient to store a maximum value of the monotonic counter; and
   incrementing the value of the monotonic counter by a step size, the incrementing of the value of the monotonic counter by the step size including:
      in response to a single memory cell of the N memory cells having a value different from zero, the single memory cell having a rank i modulo N, writing a value equal to the value of the single memory cell incremented by two times the step size, into a second memory cell of rank i+1 modulo N; and
      in response to two memory cells of the N memory cells of consecutive ranks representing values different from zero, erasing a memory cell of the two memory cells having a lower rank than a rank of the other of the two memory cells.

27. The non-transitory computer-readable medium of claim 26, wherein the method comprises:
   determining a current value of the monotonic counter, the determining of the value of the monotonic counter including:
      in response to the single memory cell of the N memory cells representing a value different from zero, determining the value of the monotonic counter is equal to the value of the single memory cell incremented by the step size; and
      in response to two memory cells of the N memory cells of consecutive ranks representing values different from zero, determining the value of the monotonic counter is equal to a value of a memory cell of the two memory cells having a rank higher than a rank of the other of the two memory cells.

28. The non-transitory computer-readable medium of claim 26, wherein the contents comprise instructions executed by the monotonic counter.

* * * * *